United States Patent
Shinohara et al.

(10) Patent No.: US 8,946,724 B1
(45) Date of Patent: Feb. 3, 2015

(54) MONOLITHICALLY INTEGRATED SELF-ALIGNED GAN-HEMTS AND SCHOTTKY DIODES AND METHOD OF FABRICATING THE SAME

(71) Applicant: HRL Laboratories, LLC, Malibu, CA (US)

(72) Inventors: Keisuke Shinohara, Thousand Oaks, CA (US); Dean C. Regan, Simi Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/907,704

(22) Filed: May 31, 2013

(51) Int. Cl.
*H01L 29/15* (2006.01)
*H01L 27/06* (2006.01)
*H01L 29/872* (2006.01)

(52) U.S. Cl.
CPC .......... *H01L 27/0605* (2013.01); *H01L 29/872* (2013.01)
USPC .............. 257/76; 257/104; 257/106; 257/183

(58) Field of Classification Search
USPC .................................. 257/76, 104, 106, 183
See application file for complete search history.

(56) References Cited

U.S. PATENT DOCUMENTS

| | | | |
|---|---|---|---|
| 5,929,467 A | 7/1999 | Kawai et al. | |
| 6,054,355 A | 4/2000 | Inumiya | |
| 6,515,320 B1 | 2/2003 | Azuma et al. | |
| 7,015,518 B2 | 3/2006 | Kobayashi | |
| 8,383,471 B1 | 2/2013 | Shinihara et al. | |
| 8,558,281 B1 | 10/2013 | Regan | |
| 8,686,473 B1 | 4/2014 | Micovic | |
| 8,698,201 B1 | 4/2014 | Regan | |
| 2008/0128753 A1 | 6/2008 | Parikh | |
| 2009/0283756 A1 | 11/2009 | Hellings | |
| 2010/0140660 A1 | 6/2010 | Wu | |
| 2011/0284865 A1 | 11/2011 | Inoue | |
| 2013/0119400 A1 | 5/2013 | Shinohara et al. | |

OTHER PUBLICATIONS

From U.S. Appl. No. 12/792,529, Application (filed Jun. 2, 2014) and Office Actions including but not limited to Office Actions dated Jun. 21, 2012, Oct. 15, 2012, Jun. 14, 2013, Aug. 27, 2013, and Oct. 10, 2013.

From U.S. Appl. No. 13/310,473 (now U.S. Patent No. 8,558,281), Application and Office Actions including but not limited to the Office Actions mailed on Nov. 14, 2012, Jan. 28, 2013, and Jun. 6, 2013.

(Continued)

*Primary Examiner* — Tan N Tran
(74) *Attorney, Agent, or Firm* — Ladas & Parry

(57) ABSTRACT

Monolithic integration of high-frequency GaN-HEMTs and GaN-Schottky diodes. The integrated HEMTs/Schottky diodes are realized using an epitaxial structure and a fabrication process which reduces fabrication cost. Since the disclosed process preferably uses self-aligned technology, both devices show extremely high-frequency performance by minimizing device parasitic resistances and capacitances. Furthermore, since the Schottky contact of diodes is formed by making a direct contact of an anode metal to the 2DEG channel the resulting structure minimizes an intrinsic junction capacitance due to the very thin contact area size. The low resistance of high-mobility 2DEG channel and a low contact resistance realized by a n+GaN ohmic regrowth layer reduce a series resistance of diodes as well as access resistance of the HEMT.

18 Claims, 8 Drawing Sheets

(56) References Cited

OTHER PUBLICATIONS

From U.S. Appl. No. 13/968,185, Application (filed Aug. 15, 2013) and Office Actions including but not limited to the Office Action mailed on Dec. 6, 2013.

From U.S. Appl. No. 14/101,102, Application (filed Dec. 9, 2013) and Office Actions.

Chen, "High-transconductance self-aligned AlGaN/GaN modulation-doped field-effect transistors with regrown ohmic contacts", Appl. Phys. Lett., vol. 73 (1998), pp. 3147-3149.

Heikman, "Mass transport regrowth of GaN for ohmic contracts to AlGaN/GaN", Appl. Phys. Lett. vol. 78, 2001, pp. 2876-2878.

Hong, "Low-resistance Ohmic contacts for high-power GaN field-effect transistors obtained by selective area growth using plasma-assisted molecular beam epitaxy", Appl. Phys. Letters 89, (2006), pp. 042101-1 to 04210-3.

Kawai, "AlN/GaN insulated gate heterostructure FET with regrown n+ GaN ohmic contact", Electronics Letters, vol. 34, (1998), pp. 592-593.

Micovic, et al., "GaN HFET for W-band Power Applications", Electron Devices Meeting IEDM p. 1-3 (2006).

Moon, "55% PAE and High Power Ka-Band GaN HEMTs With Linearized Transconductance via n+GaN Source Contact Ledge", IEEE Electron Device Letters, vol. 29, No. 8, Aug. 2008, pp. 834-837.

Shinohara, "Scaling of GaN HEMTs and Schottky Diodes for Submillimeter-Wave MMIC Applications," published in IEEE Transactions on Electron Devices, vol. 60, No. 10, Oct. 2013, pp. 2982-2996.

U.S. Appl. No. 12/792,529, filed Jun. 2, 2010, Micovic.

U.S. Appl. No. 13/310,473, filed Dec. 2, 2011, Dean C. Regan.

J. Ho, et al. GaAs IC Symposium Proceedings, Proceedings, p. 301, 1988.

Shinohara, K., et al. "Self-Aligned-Gate GaN-HEMTs with Heavily-Doped n+–GaN Ohmic Contacts to 3DEG" Dec. 2012.

Shinohara, K., et al. "GaN HEMTS and Schottky Diodes for Sub-Millimeter-Wave MMICs" IMS/RFIC2013 Workshop, Washington State Convention Center, Seattle, WA Jun. 3, 2013.

Micovic, M., et al. "GaN HFET for W-band Power Applications," Electron Devices Meeting IEDM, pp. 1-3 (2006).

U.S. Appl. No. 14/464,077, Shinohara, filed Aug. 20, 2014.

From U.S. Appl. No. 12/792,529 (now U.S. Patent No. 8,686,473), Office Action mailed on Feb. 27, 2014.

From U.S. Appl. No. 14/464,077 (filed on Aug. 20, 2014; unpublished; and request not to publish filed), Application and Office Actions.

MONOLITHICALLY INTEGRATED SELF-ALIGNED GAN-HEMTS AND SCHOTTKY DIODES AND METHOD OF FABRICATING THE SAME

STATEMENT REGARDING FEDERALLY SPONSORED RESEARCH OR DEVELOPMENT

This invention was made pursuant to US Government Contact No. HR0011-09-C-0126 issued by DARPA and therefore the US Government may have certain rights in this invention.

CROSS REFERENCE TO RELATED APPLICATIONS

This application is related to U.S. provisional patent application Ser. No. 61/772,753 filed Mar. 5, 2013 and entitled "Method Of Fabricating Self-Aligned Gate FETs" the disclosure of which is hereby incorporated herein by reference.

This application is also related to U.S. patent application Ser. No. 12/792,529 filed Jun. 2, 2010 titled "Apparatus and Method for Reducing the Interface Resistance in GaN Heterojunction FETs" the disclosure of which is hereby incorporated herein by reference.

This application is also related to U.S. patent application Ser. No. 13/310,473 filed Dec. 2, 2011 titled "Gate metallization methods for self-aligned sidewall gate GaN HEMT" the disclosure of which is hereby incorporated herein by reference.

TECHNICAL FIELD

This invention relates to Monolithically Integrated self-aligned GaN-HEMTs and Schottky diodes and a method of making same

BACKGROUND

Typically, the layer structure required for high performance Schottky diodes is significantly different from the layer structure conventionally used for High Electron Mobility Transistors (HEMTs). In the previous work on monolithic integration of HEMTs and Schottky diodes, the diode epi-layers consisting of a lightly-doped Schottky barrier layer and a highly-doped n+ contact layer were grown on the HEMT epi-layers consisting of a high mobility channel with 2 dimensional electron gas (2DEG). See J. Ho et al., GaAs IC Symposium Proceedings, Proceedings, p. 301, 1988. Since the diode structure was stacked on the HEMT structure according to Ho, Ho's fabrication process consists of two separate steps. The first step is to fabricate Schottky diodes and remove the diode epi layers from areas where HEMTs are to be fabricated. The Schottky diodes are typically a vertical structure, where an air-bridge interconnect technology is needed to minimize parasitic capacitances. The second step is to fabricate the HEMTs. This two step process is complicated and thus increases cost of the epitaxial wafers being produced by this fabrication process.

Monolithic integration of high-frequency GaN-HEMTs and GaN-Schottky diodes as disclosed herein is significant because it allows for the design of millimeter-wave and sub-millimeter-wave receiver front-ends which may include low noise amplifiers, diode mixers, low-noise IF amplifiers, and varactor controlled HEMT VCOs all on the same chip. This patent describes device structures and a fabrication technique of monolithically integrated GaN-based HEMTs and Schottky diodes fabricated on a single epitaxial structure. The integrated HEMTs/Schottky diodes are realized using an epitaxial structure and a fabrication process which should reduce fabrication costs compared to prior art techniques. Since the disclosed process preferably uses self-aligned technology, both devices show extremely high-frequency performance by minimizing device parasitic resistances and capacitances. Furthermore, since the Schottky contact of diodes is formed by making a direct contact of an anode metal to the 2DEG channel the resulting structure minimizes an intrinsic junction capacitance due to the very thin contact area size. The low resistance of high-mobility 2DEG channel and a low contact resistance realized by n+GaN ohmic regrowth reduce a series resistance of diodes as well as an access resistance of HEMTs.

BRIEF DESCRIPTION OF THE INVENTION

In one aspect the present invention provides a HEMT and Schottky diode integrated circuit disposed on a common substrate. A back barrier layer is preferably disposed on the common substrate and at least under the HEMT. A 2DEG channel layer is disposed on the common substrate under the HEMT and adjacent an anode of the Schottky diode. A low resistance layer is also disposed on the back barrier layer, the low resistance layer having cavities therein under said HEMT and under said Schottky diode, the cavity therein under said HEMT having sidewalls which immediately abut sidewalls of said 2DEG channel layer disposed on said common substrate under said HEMT and the cavity therein under said Schottky diode having sidewalls which immediately abut sidewalls of said 2DEG channel layer disposed on said common substrate in the cavity under the Schottky diode, the 2DEG channel layer disposed on said common substrate in the cavity under the Schottky diode having further sidewalls which abut the anode. A top barrier layer is disposed over the low resistance layer. A T-shaped gate is provided which includes a projection or leg disposed over said top barrier layer and over the 2DEG channel layer disposed on the common substrate under the HEMT. Drain and source electrodes are disposed on the low resistance layer and spaced from the leg of the T-shaped gate. One or more cathode electrodes are disposed on said low resistance layer and spaced from said anode.

In another aspect the present invention provides a method of making a HEMT and Schottky diode integrated circuit device comprising the steps of:
  a. providing a substrate;
  b. disposing a back barrier layer on said substrate;
  c. disposing a channel layer on said back barrier layer;
  d. disposing a top barrier layer on said channel layer;
  e. optionally forming a cap layer on said top barrier layer;
  f. depositing a first mask over at least said back layer, said channel layer and said top barrier layer and patterning same to define two regions of said first mask, one region of which is used in forming the HEMT device and the other region of which will is used in forming said Schottky diode;
  g. removing at least said channel layer and said top barrier layer where not protected by said two regions of said first mask to thereby define edges in said channel layer and in said top barrier layer;
  h. depositing a second mask in regions not projected by said first mask and removing said two regions of said first mask to thereby form two openings in said second mask, a first one of said opening being associated with the HEMT device and the second one of the openings being associated with the Schottky diode;

i. forming sidewall spacers on exposed sidewalls of said first and second openings;

j. increasing the depth of a portion of the first opening as needed so that a gate opening between the sideway spacers in said first opening meets said top barrier layer or the optionally formed cap layer;

k. increasing the depth of a portion of the second opening as needed so that an anode opening between the sideway spacers in said second opening at least penetrates said low resistance layer;

l. filing said first and second openings and said gate opening and anode opening with metal, the metal in said first opening and in said gate opening forming a gate of the HMET device and the metal in the second opening and in the anode opening forming an anode of the Schottky diode;

m. forming first and second metal contacts on said barrier layer abutting at least edges of said low resistance layer, the metal first and second contacts being disposed spaced a distance from a projecting portion of the gate metal; and n. forming third and forth metal contacts on said barrier layer abutting at least edges of said low resistance layer, the metal third and second forth contacts being disposed spaced a distance from the anode metal.

In yet another aspect the present invention provides a diode comprising:

a. a metallic anode structure;

b. an 2DEG carrier region disposed laterally of said anode structure, the 2DEG carrier region having a proximate edge at a first end said 2DEG carrier region, the first edge being in physical contact with said metallic anode structure, said 2DEG carrier region having a distal edge at a second end of said 2DEG carrier region which is laterally spaced from said proximate edge;

c. a low resistance doped semiconductor region disposed laterally of said 2DEG carrier region and spaced from said metallic anode structure, the low resistance doped semiconductor region having a proximate edge in contact with the distal edge of said 2DEG carrier region; and d. a metallic cathode structure in contact with said low resistance doped semiconductor region.

In still yet another aspect the present invention provides an integrated circuit including at least one transistor and at least one diode, the integrated circuit comprising:

a. metallic anode structure;

b. an 2DEG carrier region disposed laterally of said anode structure, the 2DEG carrier region having a proximate edge at a first end said 2DEG carrier region, the first edge being in physical contact with said metallic anode structure, said 2DEG carrier region having a distal edge at a second end of said 2DEG carrier region which is laterally spaced from said proximate edge;

c. a low resistance doped semiconductor region disposed laterally of said 2DEG carrier region and spaced from said metallic anode structure, the low resistance doped semiconductor region having a proximate edge in contact with the distal edge of said 2DEG carrier region;

d. a metallic cathode structure in contact with said low resistance doped semiconductor region;

e. a T-shaped gate having a leg which projects from a head portion of said T-shaped gate;

f. another 2DEG carrier region disposed under said leg of said T-shaped gate;

g. second and third low resistance doped semiconductor regions disposed laterally of said another 2DEG carrier region, the second and third low resistance doped semiconductor regions each having an edge in contact with an edge of said another 2DEG carrier region;

h. a metallic source and drain electrodes in contact respectively with said second and third low resistance doped semiconductor regions;

i. said 2DEG carrier region, said low resistance doped semiconductor region disposed laterally of said 2DEG carrier region, said another 2DEG carrier region and said second and third low resistance doped semiconductor regions all supported by a common substrate and wherein said 2DEG carrier region, said low resistance doped semiconductor region disposed laterally of said 2DEG carrier region, said another 2DEG carrier region and said second and third low resistance doped semiconductor regions all lie in a common plane.

ADDITIONAL DOCUMENTS INCORPORATED BY REFERENCE

Incorporated by reference herein is a paper entitled "Self-Aligned-Gate GaN-HEMTs with Heavily-Doped n+-GaN Ohmic Contacts to 2DEG" by K. Shinohara et al., published in USA, December, 2012, a copy of same is attached hereto as Appendix A.

Also incorporated by reference herein is a paper entitled "Self-Aligned-Gate GaN-HEMTs with Heavily-Doped n+-GaN Ohmic Contacts to 2DEG" by K. Shinohara et al., published in USA, December, 2012, a copy of same is attached hereto as Appendix B.

Also incorporated by reference herein is a presentation entitled "GaN HEMTs and Schottky Diodes for Sub-Millimeter-Wave MMICs" scheduled to be presented after the filing date of this application, namely, on Jun. 3, 2013 at IMS/RFIC2013 Workshop, Washington State Convention Center, Seattle, Wash., a copy of same is attached hereto as Appendix C.

DETAILED DESCRIPTION

Figure 1A:
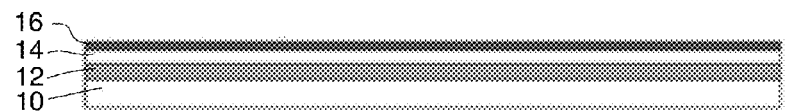
FIGS. 1a-1u show a fabrication processing flow sequence for making the integrated GaN HEMT/Schottky diode of the present invention.
Figure 1B:
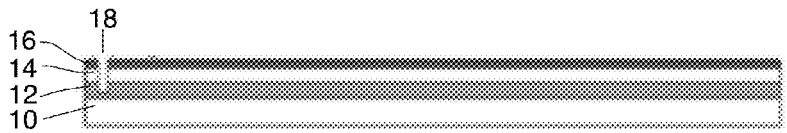
Figure 1C:
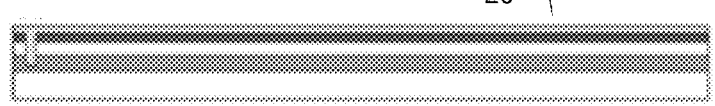
Figure 1D:
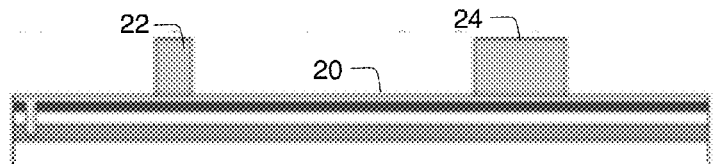
Figure 1E:
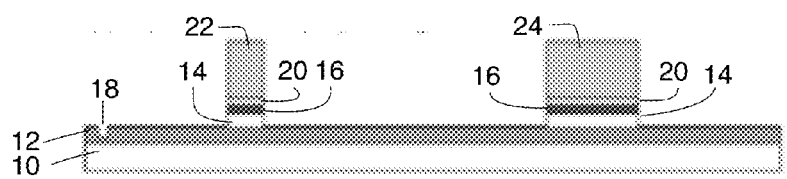
Figure 1F:
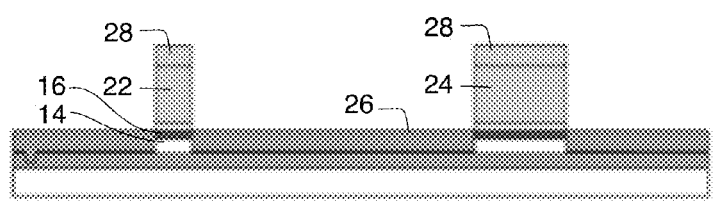
Figure 1G:
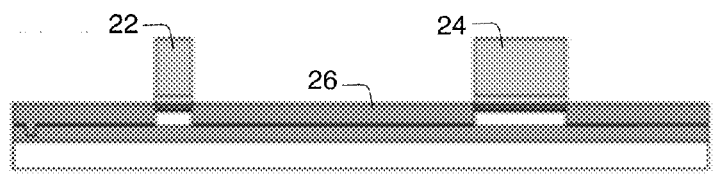
Figure 1H:
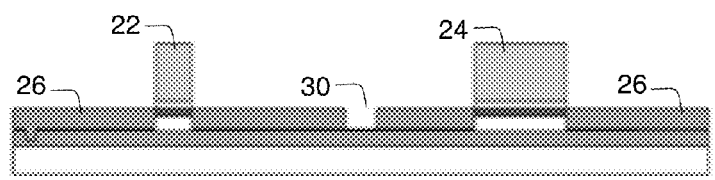
Figure 1I:
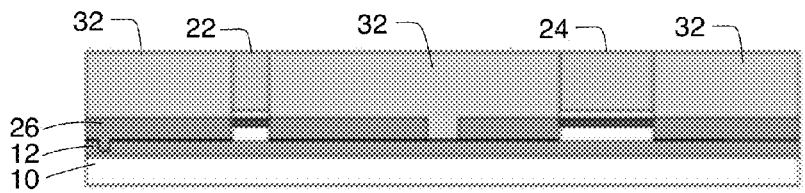
Figure 1J:
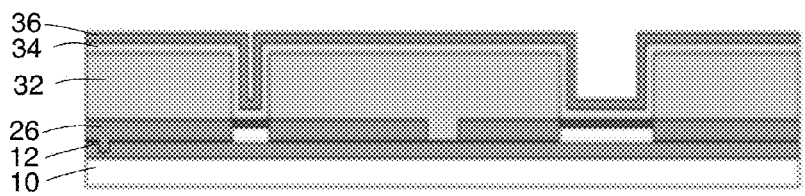
Figure 1K:
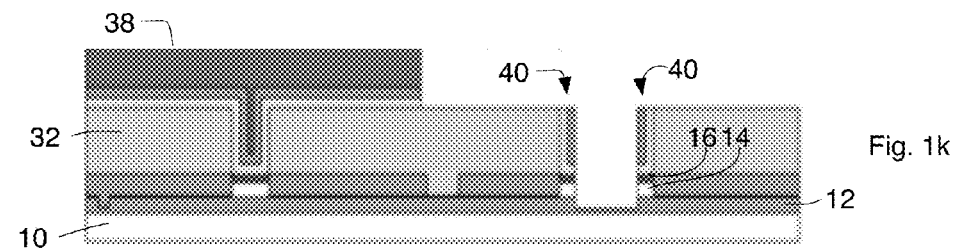
Figure 1L:
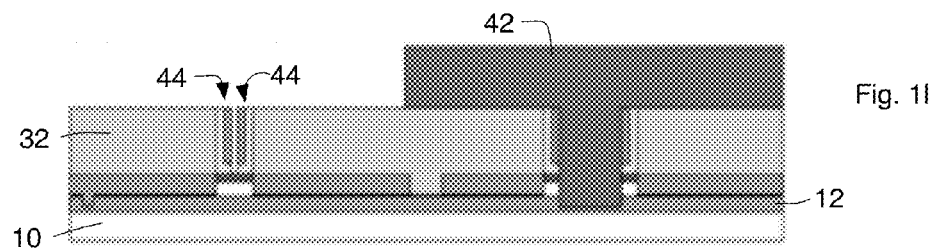
Figure 1M:
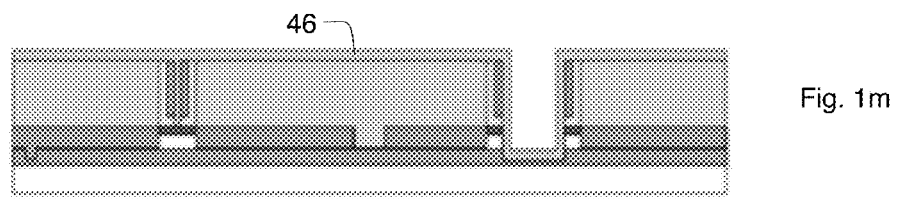
Figure 1N:
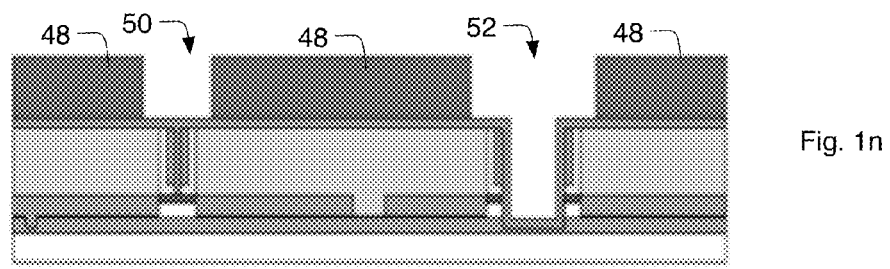
Figure 1O:
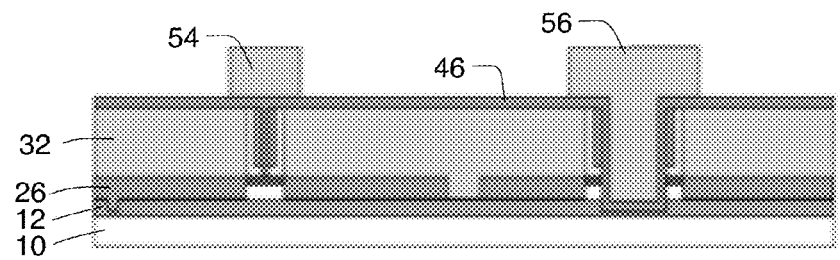
Figure 1P:
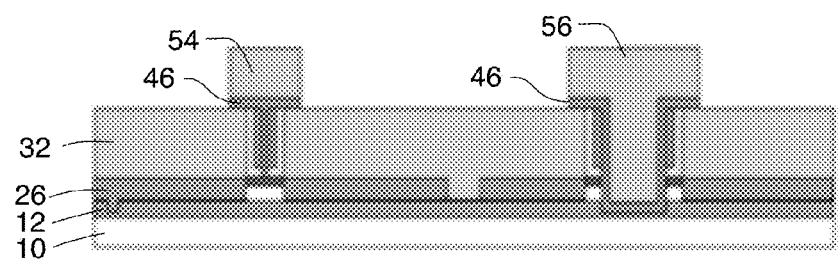
Figure 1Q:
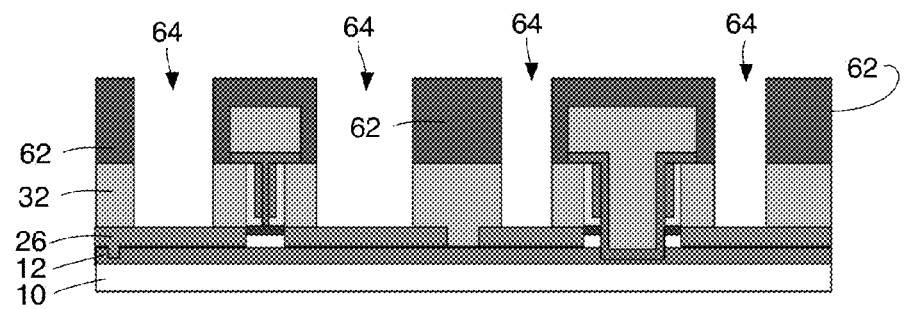
Figure 1R:
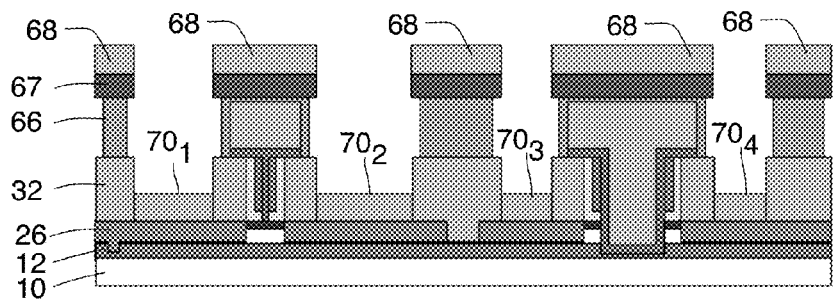
Figure 1S:
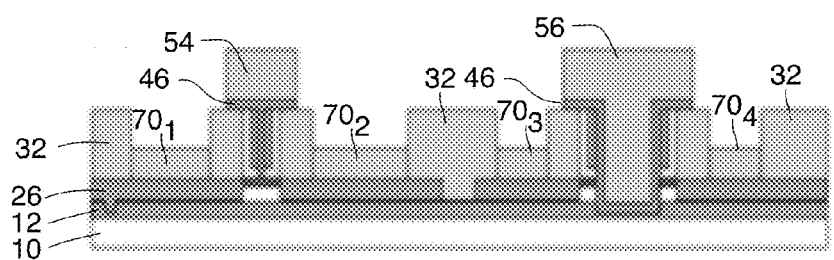
Figure 1T:
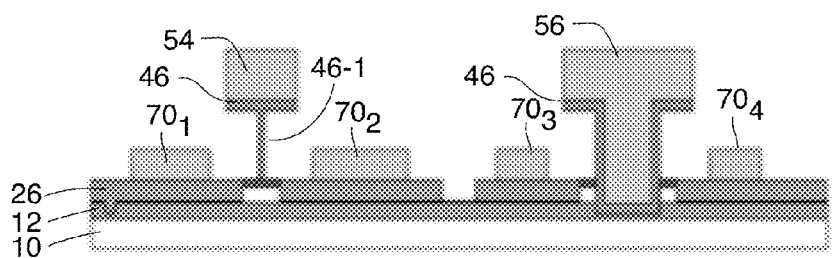
Figure 1U:
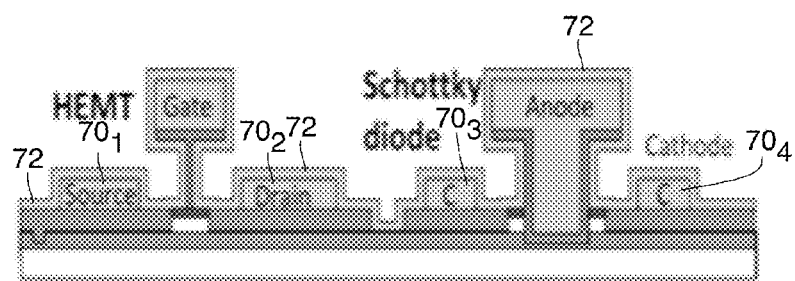

FIGS. 1a-1u show a fabrication processing flow sequence for making an embodiment of the integrated GaN HEMT/Schottky diode of the present invention. The first steps in the preferred fabrication sequence will now be described with reference to FIG. 1a. FIG. 1a shows GaN-based HEMT epitaxial growth by Molecular Beam Epitaxy (MBE) or Metal Organic Chemical Vapor Deposition (MOCVD) on a substrate 10 which may be sapphire, SiC, silicon, GaN, etc. The HEMT epitaxial layers preferably comprise an AlGaN back barrier layer 12 disposed on substrate 10, a GaN channel layer 14 disposed on layer 12, and an AlGaN top barrier layer 16 disposed on layer 14, all of which layers 12-16 are preferably grown by MBE or MOCVD. Alternatively, layer 12 can be GaN or InGaN/GaN, layer 14 can be InGaN or AlGaN, and layer 16 can be AlN or InAlN. The thickness of layer 12 is preferably about ⅓ of the gate length of the HEMT to suppress the short channel effect. The thickness of the layer 14 preferably ranges from about 5 nm to about 40 nm while the thickness of layer 16 preferably ranges from about 1 nm to about 20 nm.

Next, as an alignment mark 18 (see FIG. 1b) is preferably formed by dry etching layers 12-16 and the exposed surface is protected by applying a layer of $SiO_2$ 20 (see FIG. 1c) to the exposed surface preferably using Plasma-Enhanced Chemical Vapor Deposition (PECVD). The alignment mark 18 is preferably used to help define the locations of HSQ islands 22 and 24, and openings 50 and 52 shown in FIG. 1n for better overlay accuracy between these layers. Typically, alignment marks are formed by metal patterns, but since a high temperature (600-700° C.) ohmic regrowth process is used during this process, an alignment mark formed by etching the epitaxial layer is used to prevent deformation of the alignment mark during the ohmic regrowth process.

Initial patterning is accomplished by laying down a layer of a EBeam resist (preferably hydrogen silsesquioxane (HSQ)) is used as the EBeam resist) which is patterned into two islands 22 and 24 of EBeam resist preferably using E-beam lithography to define the islands 22 and 24 as shown by FIG. 1d. The thickness of the HSQ islands is preferably about 3500 Å. If desired, $SiO_2$ can be used instead of HSQ as the material to form islands 22 and 24, but such processing will tend to use additional processing steps in order to form islands 22 and 24.

Next, as shown by FIG. 1e, an etch (and preferably a Reactive Ion Etch (RIE)) is used to etch through to layer 12 in regions unprotected by the islands 22 and 24 of the EBeam resist. The depth of this etch is preferably controlled the controlling the etch time. The etch depth is not critical in determining device performance of both HEMTs and Schottky diodes as long as the GaN channel layer 14 is fully etched through.

Then as shown in FIG. 1f a n+GaN ohmic layer 26 is epitaxially grown by MBE or MOCVD. This epitaxial growth occurs after the original epitaxial growth of the HEMT structure layers 12-16 by MBE or MOCVD, and thus the n+GaN ohmic layer 26 may be called a "regrowth" layer herein. The n+GaN layer is highly doped, preferably $>5\times10^{19}$ cm. Polycrystalline n+GaN occurs 28 on islands 22 and 24 and is removed as depicted by FIG. 1g preferably by a wet etch preferably using $NH_4OH$ and NMP (1-Methyl-2-pyrrolidon)-based photoresist stripper. Note how the edges of layer 26 of the n+GaN ohmic regrowth abut against the edges of layers 14 and 16 under the islands 22 and 24 of HSQ photoresist—this will result in those edges of layer 26 of n+GaN ohmic regrowth being self-aligned relative to the yet to be formed gate of the HEMT device and the yet to be formed anode of the Schottky diode. The height of layer 26 is preferably same as or somewhat greater than the combined heights of layers 14 and 16 in FIG. 1f. The height of layer 26 can be achieved empirically.

The HEMT device formed by the disclosed method will be disposed on the left hand side of FIGS. 1a-1u while the Schottky diode formed by the disclosed method will be disposed on the right hand side of these same figures. An opening 30 (see FIG. 1h) is desirably formed in the layer of n+GaN ohmic regrowth material 26 to isolate these two devices.

Next a thick layer 32 of SiN is applied preferably by PECVD and the resulting exposed surface is preferably planarized by Chemical Mechanical Planarization (CMP) in order to yield a flat uniform surface with the islands 22 and 24 exposed as shown in FIG. 1i. The islands 22 and 24 of HSQ photoresist and the underlying layers 20 of $SiO_2$ are etched away and the resulting exposed surfaces, including the sidewalls in layer 32, are covered with a layer 34 of $SiO_2$ and a layer 36 of SiN preferably using PECVD to form those layers (see FIG. 1j).

Even though it is not depicted in the process flow of FIGS. 1a-1u, preferably SiN layer 32 directly over the area of alignment mark 18 is etched away by a wet etch preferably using a Buffered Oxide Etch (BOE) wet etch in order to reveal the topology of the alignment mark 18.

The HEMT device being formed on the left hand side of FIG. 1k is protected by a layer of photoresist 38 using photolithography to pattern it. The layer of photoresist 38 can be most any positive-tone or negative-tone photoresist. Examples include PR955-2.1 photoresist, and ZEP or PMMA EBeam resist. The previously applied layer 34 of SiN and the layer 36 of $SiO_2$ are removed preferably using an Inductively Coupled Plasma (ICP) RIE, leaving sidewalls 40 of $SiO_2$/SiN on the exposed sidewalls of layer 32. A RIE is used to etch through layers 14 and 16 preferably into layer 12 as shown in FIG. 1k and as discussed above with respect to FIG. 1f.

The Schottky diode being formed on the right hand side of FIG. 1l is protected by a layer of photoresist 42 using photolithography to pattern it. Layer 42 can be formed from the same choice of photoresist materials as layer 38. The previously applied layer 34 of $SiO_2$ and the layer 36 of SiN are removed preferably using an ICP RIE, leaving sidewalls 44 of $SiO_2$/SiN on the exposed sidewalls of layer 32.

Figures 2, 2A:
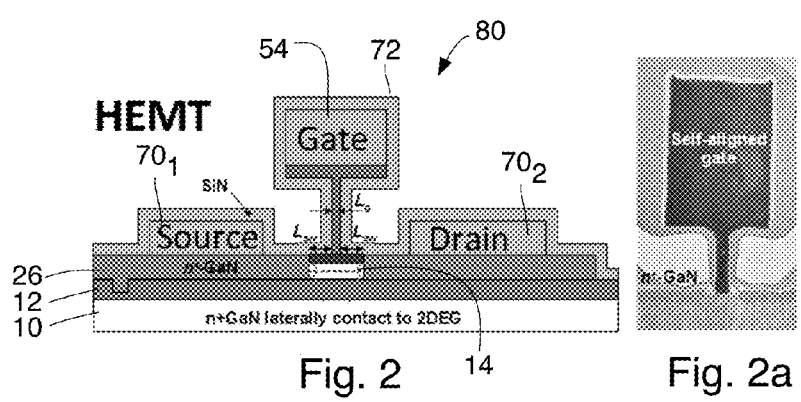
FIGS. 2 and 2a show a cross-sectional view and a TEM image of the T-shaped gate fabricated for the HEMT structure.

A layer 46 of Pt is applied to the exposed surfaces preferably by Atomic Layer Deposition (ALD) as shown in FIG. 1m. The reason for using ALD process is to conformally deposit Pt in the openings between 44 sidewalls and 40 sidewalls. The cross-sectional TEM image in FIG. 2a shows the Pt layer in the gate foot region as well as the bottom of the gate head. The reader can see the conformal Pt layer under the gate head and the anode head. The layer 46 of Pt is covered by a layer 48 of photoresist which is patterned by electron beam or photolithography to form openings 50 and 52 therein (see FIG. 1n). Depending on the sizes of the openings 50 and 52, which will range from 300 nm to a few microns, either EBeam resist (ZEP/PMMA) or photoresist can be used for the layer 48 of photoresist. Opening 50 will help define the gate head of the HEMT device being formed and opening 52 will help define the anode head of the Schottky diode being formed. Gold is plated and the photoresist 48 removed leaving an island 54 of gold in the former opening 50 and another island 56 of gold in the former opening 52 as shown in FIG. 1o. The exposed portion of layer 46 is ion milled away so that the Pt remains only under gold islands 54 and 56 as shown in FIG. 1p.

Next, as shown in FIG. 1q, openings 64 are formed in the layer 32 of SiN using a suitable photoresist 62 and standard photography techniques, followed by ICP RIE of the SiN layer 32 preferably using a $CF_4$-based gas to thereby expose the underlying layer 26 in openings 64. After removing the photoresist 62, a two new layers 66 and 67 of photoresist 66 (see FIG. 1r) are applied to the exposed surface and photolithographically imaged together. Layer 66 is a resist and preferably Polymethylglutarimide (PMGI) while layer 67 is a photoresist and preferably a SPR 955 photoresist made by Dow Chemical Company. When the two layers (66 and 67) are exposed to a developer, preferably MF-26A, layer 66 is undercut somewhat compared to layer 67. Next occurs the deposition of the ohmic metal contacts $70_1$-$70_4$. Contacts $70_1$-$70_4$ preferably consist of Pt/Au and preferably are formed by evaporation deposition of the Pt/Au metal in a vacuum chamber (evaporator) so that all four $70_1$-$70_4$ contacts depicted by FIG. 1r are formed at the same time. The evaporation disposition of the Pt/Au metal also results in metal regions 68 on top of layer 67. Lift-off of metal regions 68 where they are disposed on the photoresist 67 occurs when the layers 66 and 67 are removed. This process allows the layers of Pt/Au to remain as islands 70 of Pt/Au where the openings 64 in the SiN layer 32 occur (see FIG. 1s) to thereby define ohmic metal contacts 70 of the HEMT and the Schottky Diode. The two contacts 70 on the left hand side of FIG. 1s will become the source and drain contacts of the HEMT device while the two contacts 70 depicted on the right hand side of FIG. 1s are preferably connected in common (see also FIG. 4) and form the cathode of the Schottky diode.

The openings 64 in layer 32 of SiN are preferably positioned using a stepper with the alignment mark 18 as a guide. The alignment mark 18 is covered by the regrowth layer 32 but even though the surface of the regrown n+GaN on the alignment marks is drawn to be flat, a surface topology of the alignment mark is still maintained on the n+GaN layer 32. The depth of the alignment mark is preferably about 2000 Å while the thickness of the n+GaN layer 32 is preferably about 500 Å. So the alignment mark can still be detected after the n+GaN layer 32 regrowth. The two steps (SiN etch and ohmic metal lift-off steps) are patterned preferably using a stepper. The alignment accuracy for the ohmic metal lift-off step is not particularly critical that some misalignment between the SiN etch and ohmic metal lift-off steps should not adversely affect device performance. In this device, source and drain in the HEMT as well as cathode in the diode are defined by the regrown n+GaN which is a self-aligned process. The processing so far is be either self-aligned or the placement (like opening 30 and the openings noted just above) is not that critical. Only the self-aligned features are critical for the performance.

Next, as can be seen in FIG. 1t the remaining portions of layer 32 of SiN and the sidewalls 40 and 44 (see FIGS. 1k and 1l) are removed by wet etching, for example, a BOE wet etch. The T-shaped gate has two arms which are disposed laterally over the top barrier layer 12 and over the 2DEG channel layer 14 and has a thin leg (labeled 46-1 in this figure only) which projects downwardly in FIG. 1t to support the head of the T-shaped gate alone until, as can be seen in FIG. 1u, a surface passivation layer 72 of SiN is preferably applied over the exposed surfaces (including on the exposed sides of leg 46-1) using PECVD. The remaining SiN from layer 32 is preferably removed before adding SiN as a passivation layer 72 since the passivation layer 72 is thinner than is layer 32. If the remaining SiN from layer 32 were not removed before adding SiN as passivation layer 72, the SiN would be rather thick and thereby adversely affect parasitic capacitance and thus reduce the high frequency response of disclosed device.

In FIG. 1u two regions 70 are marked "source" and "drain" on the left hand side of this figure. Those regions (70) are the source and drain contacts. The source and drain active regions occur in the n+GaN ohmic regrowth material underlying those contacts 70. Similarly, in FIG. 1u two regions 70 are marked "C". Those two regions (70) are the cathode contact(s). The cathodic active region(s) occur in the n+GaN ohmic regrowth material underlying those two cathode contacts.

The processing described above is similar to that disclosed U.S. provisional patent application Ser. No. 61/772,753 filed Mar. 5, 2013 and entitled "Method Of Fabricating Self-Aligned Gate FETs" except that steps 3 and 4 are omitted causing the resulting HEMT structure to be symmetric without the offset provided for in that US provisional patent application. In U.S. provisional patent application Ser. No. 61/772,753 filed Mar. 5, 2013 the centerline of the T-gate is offset to one side which is not needed in this particular embodiment.

Figure 3:
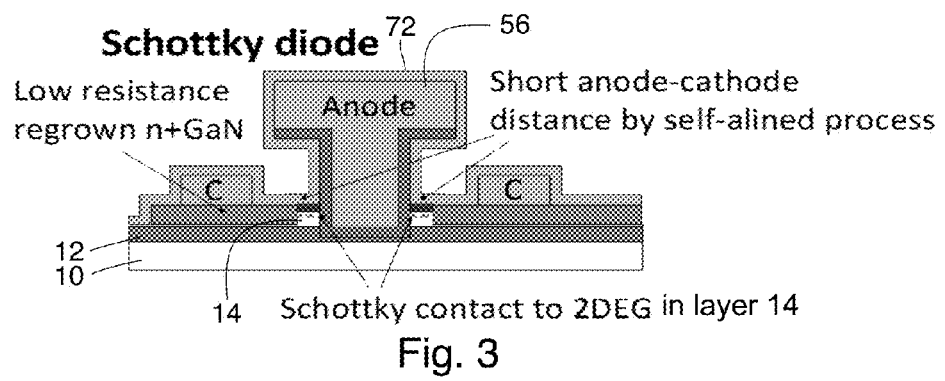
FIG. 3 depicts the T-shaped anode of Schottky diode contacting laterally to a 2DEG channel.

FIGS. 2 and 2a show a cross-sectional view (FIG. 2) and a TEM image (FIG. 2a) of T-shaped gate 80 fabricated on the HEMT structure where the gate is placed on the top surface of AlGaN top barrier (corresponding to FIG. 1u). On the other hand, T-shaped anode of Schottky diodes contacts laterally to the 2DEG channel layer 14 as illustrated in FIG. 3. Since the contact area size is defined by the thin channel thickness and not by some lithographic pattern size, the diode junction capacitance very precise and uniform when the device is manufactured. A preliminary demonstration of the Schottky diodes using the above-mentioned process was performed. The fabricated Schottky diodes exhibited an excellent DC and RF performance with a breakdown voltage of 20V and a cutoff frequency of reaching 1 THz as shown in FIGS. 5a-5d. These results pave the way to fabricate monolithically-integrated GaN-HEMT/Schottky diode MMICs operating at millimeter-wave and sub-millimeter-wave frequency ranges with enhanced functionality.

Figure 4:
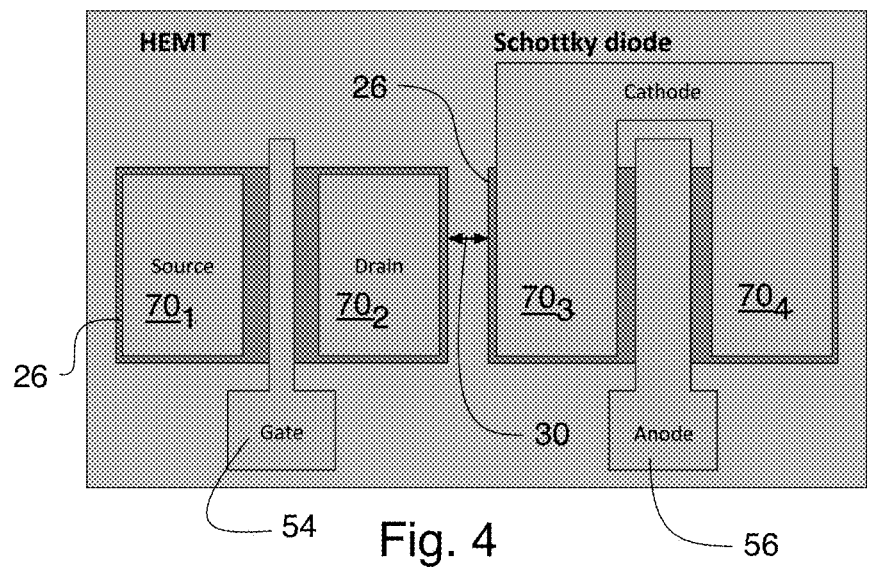
FIG. 4 is a plan view of the HEMT and Schottky diode before passivation.
Figure 5A:
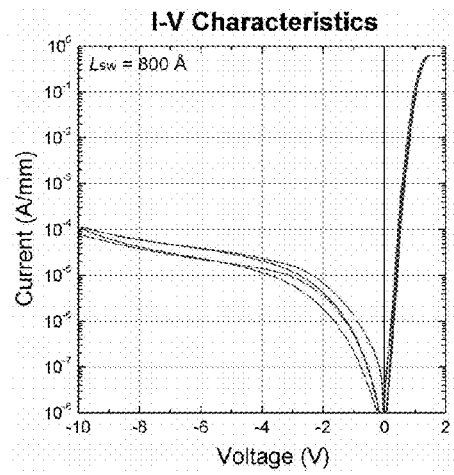
FIGS. 5a-5d depict the excellent DC and RF performance with a breakdown voltage of 20V and a cutoff frequency of reaching 1 THz of the fabricated Schottky diodes.
Figure 5B:
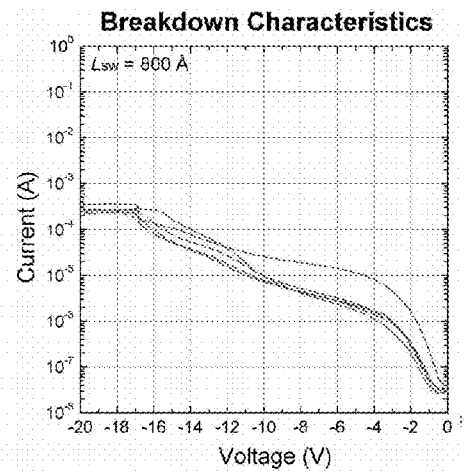
Figure 5C:
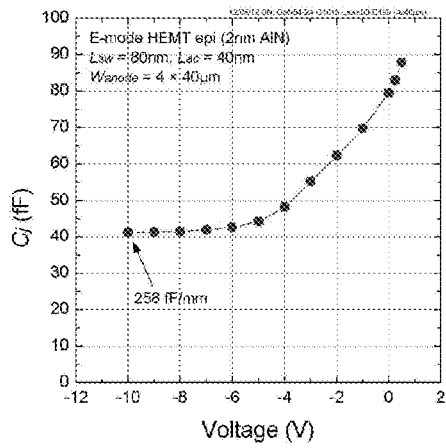
Figure 5D:
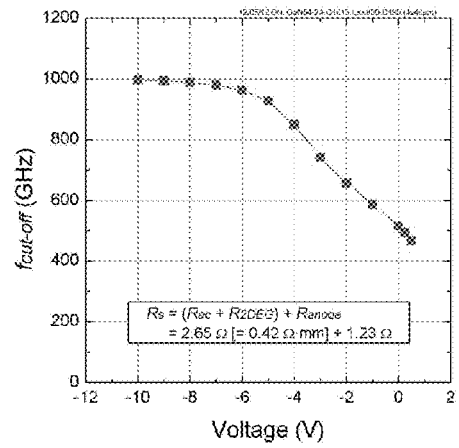

FIG. 4 is a plan view of the HEMT device and the Schottky diode before passivation. Note how the two metal contacts $70_3$ and $70_4$ which form the cathode of the Schottky diode are connected in common as shown.

Preferred and alternative materials for a number of the layers mentioned above are listed below in the following table:

| Layer | Preferred material | Alternative Material(s) |
| --- | --- | --- |
| 16 | AlGaN | AlN, InAlN, GaN/AlN, AlGaN/AlN |
| 14 | GaN | InGaN, AlGaN |
| 12 | AlGaN | GaN, InGaN/GaN |
| 22, 24 | HSQ (The spec says that this is an EBeam Resist) | $SiO_2$ |
| 26 | n + GaN | n + InGaN |
| 32 | SiN | $SiO_2$, SiON |
| 34, 72 | SiN | $Al_2O_3$, $HfO_2$, $TiO_2$, $SiO_2$, AlN, HfN |
| 36 | $SiO_2$ | $Al_2O_3$, $HfO_2$, $TiO_2$, AlN, HfN |
| 38, 42 | Photoresist | EBeam Resist |
| 48 | EBeam Resist | Photoresist |
| 54, 56 | Au | Pt |
| 68, 70 | Pt/Au | Ti/Au, Ti/Pt/Au |

If the channel layer 14 is formed from AlGaN as opposed to GaN, the junction capacitance will be reduced due to less electron density in the channel, simultaneously increasing the breakdown voltage due to the larger bandgap (critical electric field) associated with AlGaN compared to GaN.

In addition to the material modification mentioned in the preceding table, other modifications can be made. For example, consider first FIG. 1c. On top of top barrier layer 16 a cap layer may be added, if desired. See Appendix A, particularly FIG. 2 thereof, where a cap layer of either GaN (for depletion mode operation) or $Al_{0.5}Ga_{0.5}N$ (for enhancement mode operation) is utilized. Another way of looking at this is to view the top barrier layer 16 as comprising multiple layers of semiconductor material. For example, if layer 16 comprises layers of GaN and AlN (GaN/AlN) then the HMET device will operate in depletion mode. On the other hand if layer 16 comprises layers of AlGaN and AlN (AlGaN/AlN) then the HMET device will operate in enhancement mode.

Figure 6:
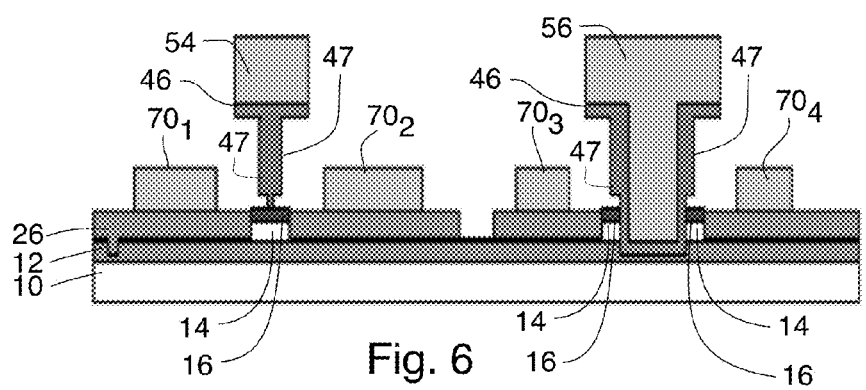
FIG. 6 depicts an embodiment of the HEMT device with added field plates.
Figure 7:
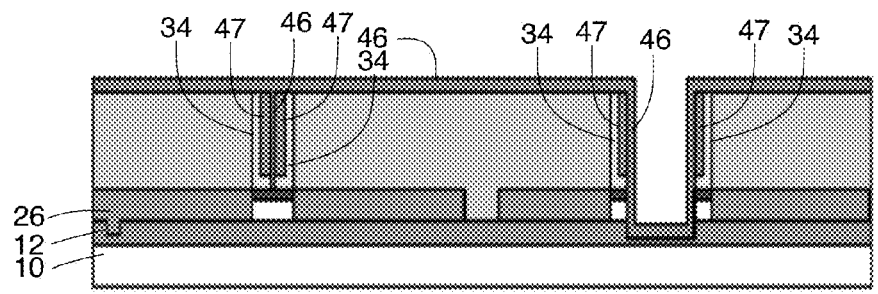
FIG. 7 depicts are alternative processing step for adding the fields plates depicted in FIG. 6.

As another example, field plates can be added to the HEMT device as follows. First consider FIG. 6 where two field plates 47 preferably of the same material (and formed at the same time as) layer 46, which plates form a nano field plate structure between the ends thereof where they confront the underlying barrier layer 16 (or cap layer if used). FIG. 6 basically corresponds to FIG. 1*t* of the processing previously described with reference to FIGS. 1*a*-1*u*, except for the addition of the previously mentioned field plates 47. In order to realize field plates 47 a change to the processing previously described with reference to FIGS. 1*a*-1*u* needs to be made which will now be described with reference to FIG. 7.

But before considering FIG. 7, consider again to FIGS. 1*k* and 1*l*. Sidewall spacers 40 and 44 have been formed of SiN from layer 34 and SiO$_2$ from layer 36. Before proceeding with deposition of Pt layer 46 (preferably by ALD), the remaining SiO$_2$ from layer 36 is removed by, for example, a wet etch, in order to form field plates 47 in the next step. Now consider FIG. 7. The field plates 47 are formed where the previously remaining SiO$_2$ from layer 36 had been disposed. Field plates 47 are formed preferably simultaneously with the deposition of layer 46 and therefor are preferably integral with layer 46 (preferably formed by ALD of Pt). Layer 46 and field plates 47 are depicted as separate regions in FIG. 7 merely to help show how the field plates 37 occupy the spaces where the remaining SiO$_2$ from layer 36 had been disposed prior to the removal of same. The remaining steps are then performed as previously described with reference to FIGS. 1*n*-1*u* to complete the HEMT device and the Schottky diode both with field plates 47.

This concludes the description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings and the accompanying claims. Additional variations of the present invention may be devised without departing from the inventive concept as set forth in the following claims.

What is claimed is:

1. A HEMT and Schottky diode integrated circuit device comprising:
   a. a common substrate for said HEMT and Schottky diode;
   b. a 2DEG channel layer disposed over said common substrate under said HEMT and adjacent an anode of said Schottky diode;
   c. a low resistance layer disposed over said common substrate, the low resistance layer having openings therein under said HEMT and under said Schottky diode, the opening therein under said HEMT having sidewalls which immediately abut sidewalls of said 2DEG channel layer disposed on said common substrate under said HEMT and the opening therein under said Schottky diode having sidewalls which immediately abut sidewalls of said 2DEG channel layer disposed on said common substrate in said opening under said Schottky diode, the 2DEG channel layer disposed on said common substrate in said opening under said Schottky diode having further sidewalls which abut said anode;
   d. a top barrier layer disposed over said low resistance layer;
   e. a T-shaped gate, the T-shaped gate having a leg disposed over said top barrier layer and over the 2DEG channel layer disposed on said common substrate under said HEMT;
   f. drain and source electrodes disposed on said low resistance layer and spaced from said T-shaped gate; and
   g. one or more cathode electrodes disposed on said low resistance layer and spaced from said anode.

2. The HEMT and Schottky diode integrated circuit device of claim 1 wherein said T-shaped gate is formed of two different metals, a first metal forming said projection of said T-shaped gate and a second different metal forming a majority of the remaining portions of the T-shaped gate.

3. The HEMT and Schottky diode integrated circuit device of claim 2 wherein said first metal is Pt and said second metal is Au.

4. The HEMT and Schottky diode integrated circuit device of claim 1 wherein the 2DEG channel layer disposed on said common substrate under said HEMT is essentially laterally centered with respect said projection of said T-shaped gate.

5. The HEMT and Schottky diode integrated circuit device of claim 1 wherein the 2DEG channel layer disposed on said common substrate comprises two portions.

6. The HEMT and Schottky diode integrated circuit device of claim 1 wherein the low resistance layer comprises a layer of a doped semiconductor.

7. The HEMT and Schottky diode integrated circuit device of claim 6 wherein the doped semiconductor is n+GaN and the 2DEG channel layer is undoped GaN.

8. The HEMT and Schottky diode integrated circuit device of claim 1 further including a cap layer disposed on said top barrier layer.

9. The HEMT and Schottky diode integrated circuit device of claim 1 further including a back barrier layer disposed on said common substrate and at least under said HEMT.

10. The HEMT and Schottky diode integrated circuit device of claim 9 wherein at least a portion of said back barrier layer is disposed between said anode and said substrate.

11. The HEMT and Schottky diode integrated circuit device of claim 9 wherein the low resistance layer is a layer of highly doped semiconductor material.

12. The HEMT and Schottky diode integrated circuit device of claim 11 wherein the layer of highly doped semiconductor material comprises n+GaN and the back barrier layer comprises undoped AlGaN.

13. The HEMT and Schottky diode integrated circuit device of claim 1 wherein the low resistance layer is a layer of highly doped semiconductor material.

14. The HEMT and Schottky diode integrated circuit device of claim 1 wherein the T-shaped gate includes a pair of arms which extend laterally of the leg thereof.

15. A diode comprising:
   a. a metallic anode structure;
   b. an 2DEG carrier region disposed laterally of said anode structure, the 2DEG carrier region having a proximate edge at a first end said 2DEG carrier region, the first edge being in physical contact with said metallic anode structure, said 2DEG carrier region having a distal edge at a second end of said 2DEG carrier region which is laterally spaced from said proximate edge;
   c. a low resistance doped semiconductor region disposed laterally of said 2DEG carrier region and spaced from said metallic anode structure, the low resistance doped semiconductor region having a proximate edge in contact with the distal edge of said 2DEG carrier region; and
   d. a metallic cathode structure in contact with said low resistance doped semiconductor region.

16. An integrated circuit including at least one transistor and at least one diode, the integrated circuit comprising:
   a. a metallic anode structure;
   b. an 2DEG carrier region disposed laterally of said anode structure, the 2DEG carrier region having a proximate edge at a first end said 2DEG carrier region, the proximate edge being in physical contact with said metallic anode structure, said 2DEG carrier region having a distal edge at a second end of said 2DEG carrier region which is laterally spaced from said proximate edge;
c. a low resistance doped semiconductor region disposed laterally of said 2DEG carrier region and spaced from said metallic anode structure, the low resistance doped semiconductor region having a proximate edge in contact with the distal edge of said 2DEG carrier region;
d. a metallic cathode structure in contact with said low resistance doped semiconductor region;
e. a T-shaped gate having a leg which projects from a head portion of said T-shaped gate;
f. another 2DEG carrier region disposed under said leg of said T-shaped gate;
g. second and third low resistance doped semiconductor regions disposed laterally of said another 2DEG carrier region, the second and third low resistance doped semiconductor regions each having an edge in contact with an edge of said another 2DEG carrier region;
h. a metallic source and drain electrodes in contact respectively with said second and third low resistance doped semiconductor regions;
i. said 2DEG carrier region, said low resistance doped semiconductor region disposed laterally of said 2DEG carrier region, said another 2DEG carrier region and said second and third low resistance doped semiconductor regions all supported by a common substrate.

17. The integrated circuit of claim 16 further including a back barrier layer disposed on said common substrate and under said 2DEG carrier region.

18. The integrated circuit of claim 16 wherein said 2DEG carrier region, said low resistance doped semiconductor region disposed laterally of said 2DEG carrier region, said another 2DEG carrier region and said second and third low resistance doped semiconductor regions all lie in a common plane.

* * * * *